(12) United States Patent
Leach et al.

(10) Patent No.: US 8,446,943 B2
(45) Date of Patent: May 21, 2013

(54) COMMUNICATION OVER POWER LINES

(75) Inventors: Richard A. Leach, Troy, MI (US);
Jeffrey T. Sieber, Livonia, MI (US);
Samuel J. Guido, Dearborn, MI (US)

(73) Assignee: Renesas Electronics America Inc., Santa Clara, CA (US)

( * ) Notice: Subject to any disclaimer, the term of this patent is extended or adjusted under 35 U.S.C. 154(b) by 430 days.

(21) Appl. No.: 12/766,204

(22) Filed: Apr. 23, 2010

(65) Prior Publication Data
US 2011/0261874 A1    Oct. 27, 2011

(51) Int. Cl.
*H03K 7/08*      (2006.01)
*H04B 3/00*      (2006.01)

(52) U.S. Cl.
USPC .......................................... 375/238; 375/257

(58) Field of Classification Search
USPC ............ 375/257, 259, 219, 238, 258; 341/40, 341/52, 53, 50; 327/31, 172; 329/312, 311, 329/314; 370/205
See application file for complete search history.

(56) References Cited

U.S. PATENT DOCUMENTS

| | | | | |
|---|---|---|---|---|
| 4,972,130 A * | 11/1990 | Rossi et al. | | 318/293 |
| 6,107,926 A * | 8/2000 | Kifuku et al. | | 340/650 |
| 6,181,587 B1 * | 1/2001 | Kuramoto et al. | | 363/98 |
| 6,772,011 B2 * | 8/2004 | Dolgin | | 607/61 |
| 7,552,006 B2 * | 6/2009 | Maeda | | 701/102 |
| 2002/0118502 A1 * | 8/2002 | Yabe et al. | | 361/93.9 |
| 2006/0256874 A1 * | 11/2006 | Bonfiglio | | 375/242 |
| 2008/0100361 A1 * | 5/2008 | Yee et al. | | 327/172 |
| 2010/0052731 A1 * | 3/2010 | Mogilner et al. | | 327/27 |
| 2011/0006853 A1 * | 1/2011 | Mohtashemi et al. | | 332/110 |

* cited by examiner

*Primary Examiner* — Tesfaldet Bocure
(74) *Attorney, Agent, or Firm* — Campbell Stephenson LLP

(57) ABSTRACT

A method and apparatus for communicating over a power line. In one embodiment of the method, a first PWM waveform signal is generated, wherein a duty cycle of the first PWM waveform signal is proportional to an amplitude of a first analog signal. A first sinusoidal waveform signal is also generated, which has a first frequency. The first sinusoidal waveform signal is modulated in relation to the first PWM waveform signal. The modulated first sinusoidal waveform signal is transmitted to a circuit via a power conductor that couples a power source to the circuit. The circuit in turn generates a demodulated signal by demodulating the modulated first sinusoidal waveform signal.

17 Claims, 5 Drawing Sheets

COMMUNICATION OVER POWER LINES

BACKGROUND OF THE INVENTION

A microcontroller (also microcomputer, MCU or μC) is a small computer on a single integrated circuit consisting internally of individual components such as a CPU, clock, timers, I/O ports, and memory that stores instructions executable by the CPU. Microcontrollers provide many functions. In automobiles, microcontrollers can be found in devices called junction boxes that control distribution of electrical power to loads such as lamps, horns, dashboard gauges, motors, coils, etc. In particular, these microcontrollers can generate signals that control multiple power driver circuits (hereinafter power drivers), which drive loads via respective conductors (e.g., insulated copper wires). The present invention will be described with reference to automobiles, it being understood that the present invention should not be limited thereto.

The cost of manufacturing automobiles increases with each conductor used to transmit power to loads. Further, power drivers in junction boxes generate heat, and to protect against adverse affects of heat generated by the power drivers, expensive cooling systems (e.g., fans) may be required to cool junction boxes.

SUMMARY OF THE INVENTION

A method and apparatus for communicating over a power line. In one embodiment of the method, a first PWM waveform signal is generated, wherein a duty cycle of the first PWM waveform signal is proportional to an amplitude of a first analog signal. A first sinusoidal waveform signal is also generated, which has a first frequency. The first sinusoidal waveform signal is modulated in relation to the first PWM waveform signal. The modulated first sinusoidal waveform signal is transmitted to a circuit via a power conductor that couples a power source to the circuit. The circuit in turn generates a demodulated signal by demodulating the modulated first sinusoidal waveform signal.

BRIEF DESCRIPTION OF THE DRAWINGS

The present invention may be better understood in its numerous objects, features, and advantages made apparent to those skilled in the art by referencing the accompanying drawings.

DETAILED DESCRIPTION

Figure 1:
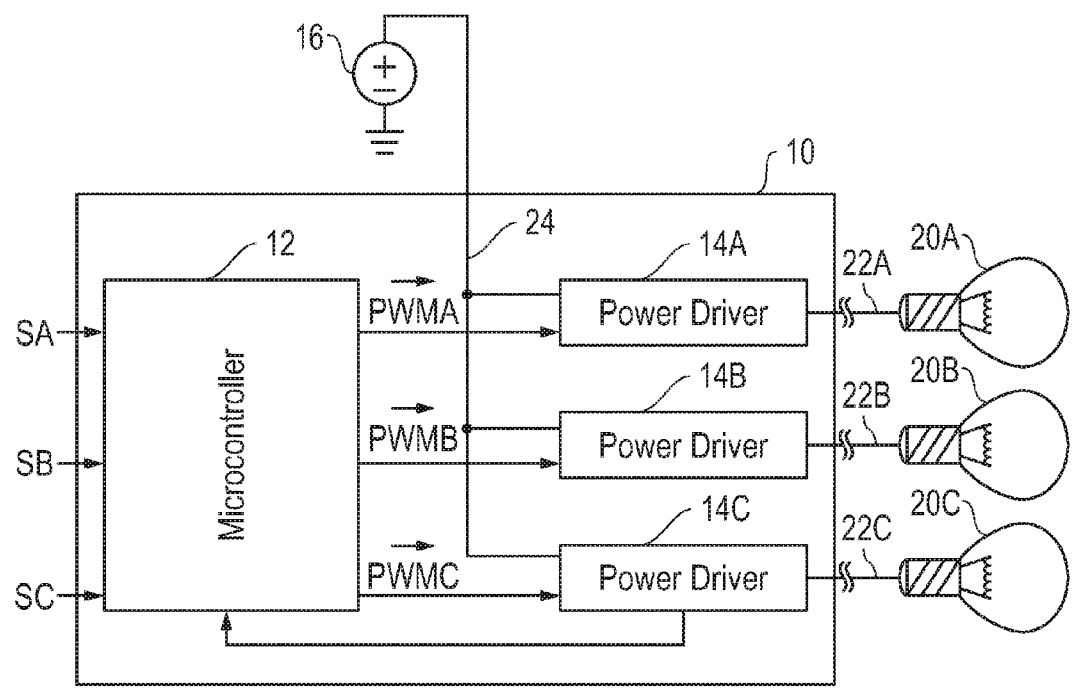
FIG. 1 illustrates relevant components of a system for distributing electrical power to various loads.

FIG. 1 illustrates, in block diagram form, relevant components of an example junction box 10 that can be employed in an automobile. Junction box 10 includes a microcontroller 12 coupled to power drivers 14A-14C, which in turn are coupled between power source 16 and lamps 20A-20C via conductors 22A-22c as shown.

Power drivers can control loads by controlling the electrical power provided thereto. For example power drivers can control the flow of electrical power to a load by varying the impedance between a power source and the load. Moreover, power drivers can vary the impedance in accordance with control signals received from microcontrollers. In fashion, microcontrollers can control loads via power drivers. In the embodiment shown in FIG. 1, drivers 14A-14C control lamps 20A-20C, respectively, in accordance with driver control signals PWMA-PWMC, respectively, generated by microcontroller 12.

Driver control signals PWMA-PWMC, in one embodiment, are pulse width modulated (PWM). Pulse width modulation uses a rectangular pulse wave whose pulse width or duty cycle is modulated, resulting in a variation of the average value of the waveform. The term duty cycle describes the portion of "on" time to the regular interval or time period of the signal. Pulse width modulated signals are digital in the sense that they are either on or off.

Figure 2:
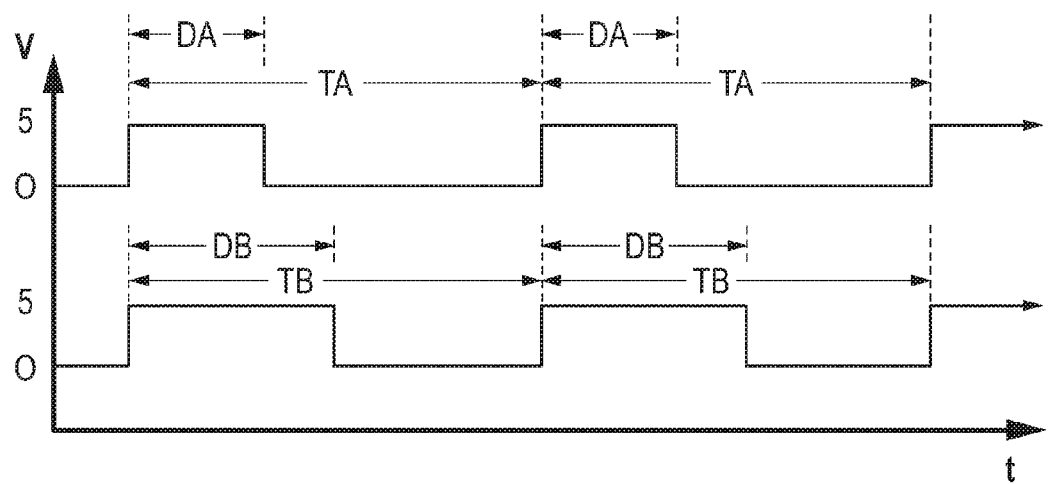
FIG. 2 graphically illustrates examples of pulse width modulated signals generated by the system shown in FIG. 1.

FIG. 2 illustrates graphical representations of example driver control signals PWMA and PWMB. In FIG. 2, DA and DB identify duty cycles for PWMA and PWMB, respectively, during time periods TA and TB, respectively. Duty cycle is typically expressed in percent with 100 percent being fully on. As seen in FIG. 2, the duty cycle DB is greater than the duty cycle DA, even though the time periods of PWMA and PWMB are the same. It should be noted that the time periods may be different for different power driver control signals.

With continued reference to FIGS. 1 and 2, microcontroller 12 generates driver control signals PWMA-PWMC. These driver control signals are tied to analog input signals SA-SC that are received from other devices (not shown) in the automobile. In one embodiment, analog input signals SA-SC vary in amplitude anywhere between 0-5 volts, it being understood that the present invention is not limited thereto. Microcontroller 12 includes, in one embodiment, one or more A/D convertors for converting analog input signals SA-SC into respective digital equivalents. In an alternative embodiment, analog input signals SA-SC can be converted into digital equivalents using one or more A/D convertors that are external to microcontroller 12. Ultimately, microcontroller 12 processes the digital equivalents of analog input signals SA-SC to generate driver control signals PWMA-PWMC, respectively.

In one embodiment, microcontroller 12 generates PWMA-PWMC with duty cycles that are proportional to the amplitude of analog input signals SA-SC, respectively. For example, when the voltage amplitude of input signal SA is 0 volts, the duty cycle of control signal PWMA is 0 percent, when the voltage amplitude of input signal SA is 2.0 volts, the duty cycle of control signal PWMA is 40 percent, and when the voltage amplitude of input signal SA is 5 volts, the duty cycle of control signal PWMA is 100 percent.

Junction box 10 is a very efficient way of providing intermediate amounts of electrical power to lamps 20A-20C. Power drivers 14A-14C couple lamps 20A-20C, respectively, to power source 16 with little or no impedance when driver control signals PWMA-PWMC, respectively, are "on," and the lamps burn at full power. Otherwise, no electrical power flows to lamps 20A-20C. In this arrangement the illumination intensity of lamps 20A-20C are controlled by the duty cycle or average "on" time of the driver control signals PWMA-PWMC, respectively. Lamps 20A-20C switch quickly between fully on and fully off multiple times during a given period of time (e.g., 100 times each second). The rate at which the lamps switch on and off are assumed to be sufficiently high that the human eye cannot detect the distinct on/off states of the lamps.

Figure 3:
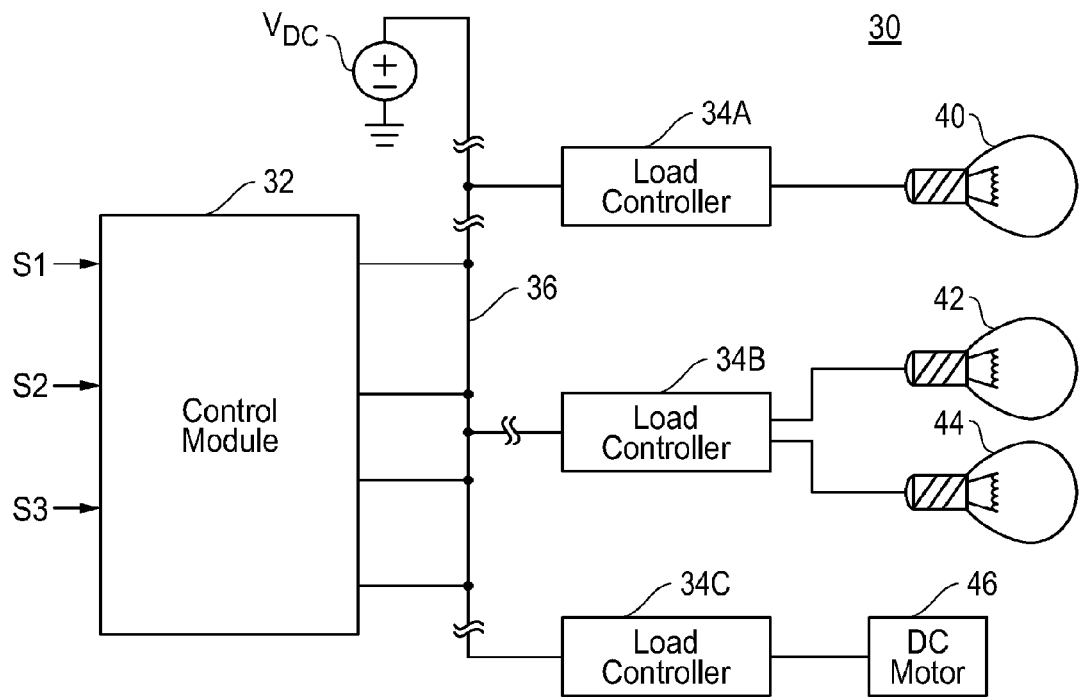
FIG. 3 illustrates in block diagram form relevant components of an alternative system 30 for distributing power.

The system shown in FIG. 1 employs several conductors 22 to transmit electrical power to lamps 20 via power drivers 14. A cooling system (not shown) may require to protect components such as microcontroller if power drivers 14 generate excessive heat. Conductors 22 and the cooling system add costs to the manufacture of an automobile that employs the system in FIG. 1. FIG. 3 illustrates in block diagram form relevant components of an alternative system 30 for distributing power within an automobile, which may be more cost effective when compared to the system shown in FIG. 1.

System 30 includes a control module 32 coupled to load controllers 34A-34C via a single conductor 36. Load controllers 34A-34C are coupled to various loads. In the illustrated example load controllers 34A-34C are coupled to lamps 40-44 and DC motor 46 as shown, it being understood that the present invention can be employed with load controllers coupled to other types of loads via a single conductor. Control module 32 may take form in one or more separate integrated circuits mounted on a printed circuit board and coupled together via electrical traces formed on the printed circuit board, it being understood that the present invention should not be limited thereto. Each of load controllers 34A-34C take form in a monolithic integrated circuit, it being understood that the present invention should not be limited thereto.

As will be more fully described below, conductor 36 transmits electrical power from a DC power source $V_{DC}$ to load controllers 34A-34C, it being understood that the present invention can be employed in a system that transmits electrical power from an alternating current (AC) power source. Moreover, control module 32 generates and transmits signals to load controllers 34A-34C via conductor 36. Load controllers 34A-34C control their loads by controlling the flow of electrical power thereto in accordance with the signals received from control module 32. One or more of load controllers 34A-34C may generate and transmit signals to control module 32 via conductor 36. The foregoing signals (i.e., the signals generated by control module 32 and the signals generated by one or more load controllers 34A-34C) can transmitted concurrently over conductor 36 as conductor 36 transmits electrical power.

Control module 32 receives analog input signals S1-S3 from other devices (not shown) in the automobile. Ultimately, analog input signals control loads 40-48 as will be more fully described below. For purposes of explanation, analog input signals S1-S3 vary in amplitude anywhere between 0-5 volts it being understood that the present invention is not be limited thereto. Control module 32 includes, in one embodiment, one or more A/D convertors for converting analog input signals S1-S3 into respective digital equivalents. In an alternative embodiment, analog input signals S1-S3 can be converted into digital equivalents using one or more A/D convertors that are external to control module 32. Control module 32 processes the digital equivalents of analog input signals S1-S3 in accordance with stored executable instructions to generate pulse width modulated signals PWM1-PWM3, respectively.

Figure 4:
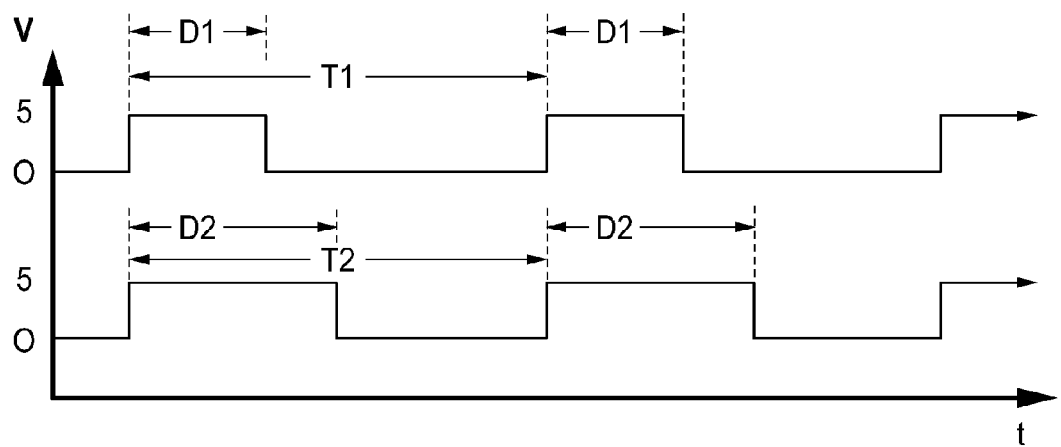
FIG. 4 graphically illustrates example pulse width modulated signals that are generated internal to control module of FIG. 3.

In one embodiment, the duty cycles of pulse width modulated signals PWM1-PWM3 are proportional to the amplitude of analog input signals S1-S3, respectively. Thus, when the voltage amplitudes of analog input signals S1-S3 change, the duty cycles of pulse width modulated signals PWM1-PWM3, respectively, change proportionately. FIG. 4 illustrates example pulse width modulated signals PWM1-PWM3 that are generated internal to control module 32. As seen in FIG. 4, the duty cycle D2 of pulse width modulated signal PWM2 is greater than the duty cycle D1 of pulse width modulated signal PWM1, even though the time periods of pulse width modulated signals PWM1 and PWM2 are the same. It should be noted that the time periods could be different for different pulse width modulated signals PWM1-PWM3.

Control module 32 may include oscillator circuits that generate sinusoidal carrier signals (hereinafter carriers) with different frequencies. In one embodiment control module 32 includes three separate oscillator circuits for generating three carriers F1-F3 with different frequencies. As well be more fully described below, control module 32 modulates carriers F1-F3 relative to the duty cycles of pulse width modulated signals PWM1-PWM3, respectively. Modulation is a process of varying one wave form in relation to another wave form. Control module 32 transmits the modulated carriers F1-F3 to load controllers 34A-34C via conductor 36.

Although not shown in FIG. 3, each of the load controllers 34A-34C includes a circuit for demodulating one of the modulated carriers F1-F3. In an alternative embodiment, load controllers may include two or more circuits for demodulating two or more modulated carriers. However, the present invention will be described with reference to each load controller 34A-34C containing a single demodulator circuit, it being understood that the present invention should not be limited thereto.

In the example embodiment, the demodulator circuit in load controller 34A demodulates only modulated carrier F1 to reproduce or substantially reproduce PWM1. Similarly, the demodulator circuit in load controller 34B demodulates only modulated carrier F2 to reproduce or substantially reproduce PWM2, and the demodulator circuit in load controller 34C demodulates only modulated carrier F3 to reproduce or substantially reproduce PMW3. As will more fully describe below, load controllers 34A-34C control the power provided to loads 40-46 in accordance with respective PWM1-PWM3 outputs of the demodulation circuits.

In one embodiment, load controller 34A couples lamp 40 to power source $V_{DC}$ with little or no impedance when the demodulated output PWM1 is "on." When the demodulated output PWM1 is "off," no electrical power flows through load controller 34A to the lamp. Lamp 40 switches quickly between fully on and fully off multiple times during a given period of time (e.g., 100 times each second). Because the duty cycle of demodulated output PWM1 is proportional to the voltage amplitude of input signal S1, light emitted by lamp 40 will have intensity as seen by an observer, which is proportional to the analog level of input signal S1.

In one embodiment, load controller 34B generates an analog signal I2 during each duty cycle of demodulated output PWM2. The amplitude of each signal I2 is proportional to its respective duty cycle. Likewise load controller 34C generates an analog signal I3 during each duty cycle of demodulated output PWM3, and the amplitude of each signal I3 is proportional to its respective duty cycle. Because the duty cycles of demodulated outputs PWM2 and PWM3 are proportional to the amplitudes of analog input signals S2 and S3, respectively, the amplitudes of analog signals I2 and I3 are proportional (if not equal or substantially equal) to the amplitudes of analog input signals S2 and S3, respectively. It is noted that as the amplitude of analog input signals S2 and S3 vary, the amplitude of the signals I2 and I3, respectively, vary accordingly.

Load controller 34B uses I2 to control lamps 42 and 44 by controlling the flow of electrical power thereto. As the amplitude of signal I2 increases or decreases, the quantity of power flowing to lamps 42 and 44 increases or decreases proportionately. Similarly, Load controller 34C uses I3 to control DC motor 46 by controlling the flow of electrical power thereto. As the amplitude of signal I3 increases or decreases, the quantity of power flowing to DC motor 46 increases or decreases proportionally.

Control module 32 is configured to diagnose operation of one or more loads using signals received from the one or more load controllers. For example, load controller 34C can sense current flow to DC motor 46, and when current flow is sensed, load controller 34C can modulate an internally generated carrier relative to the sensed current or lack thereof. For example, when current flow is sensed, a gate that couples an oscillator (e.g., a ring oscillator or an odd number invertors connected in a loop) to conductor 36, is actuated, and the carrier generated by the oscillator is transmitted to control module 32 via conductor 36. This modulated carrier is demodulated at control module 32, the result of which is processed by control module 32 to infer, for example, a short circuit (i.e., current flow to DC motor 46 even though no current should be flowing to DC motor 46 (i.e., the amplitude of S3 is 0 volts) or an open circuit (i.e., current is not flowing to DC motor 46 even though current should be flowing (i.e., the amplitude of S3 is greater than 0 volts)). In another embodiment, load controller 34C can measure the amplitude of current flow to DC motor 46, and generate a signal CF indicative thereof. Load controller can then generate a pulse width modulated signal PWMF having a duty cycle that is proportional to the amplitude of the measured current signal CF. The carrier generated by the oscillator is modulated by PWMF, the result of which is transmitted to control module 32 via conductor. Control module, in turn, can demodulate the signal it receives from load controller 34C in order to reproduce or substantially reproduce PWMF. Control module can then generate a signal IF from PWMF, the amplitude of which is proportional to the amplitude of CF. Control module 32 can process IF, after it is converted into a digital equivalent, and compare it to S3 to determine if DC motor 46 is operating properly.

Figure 5:
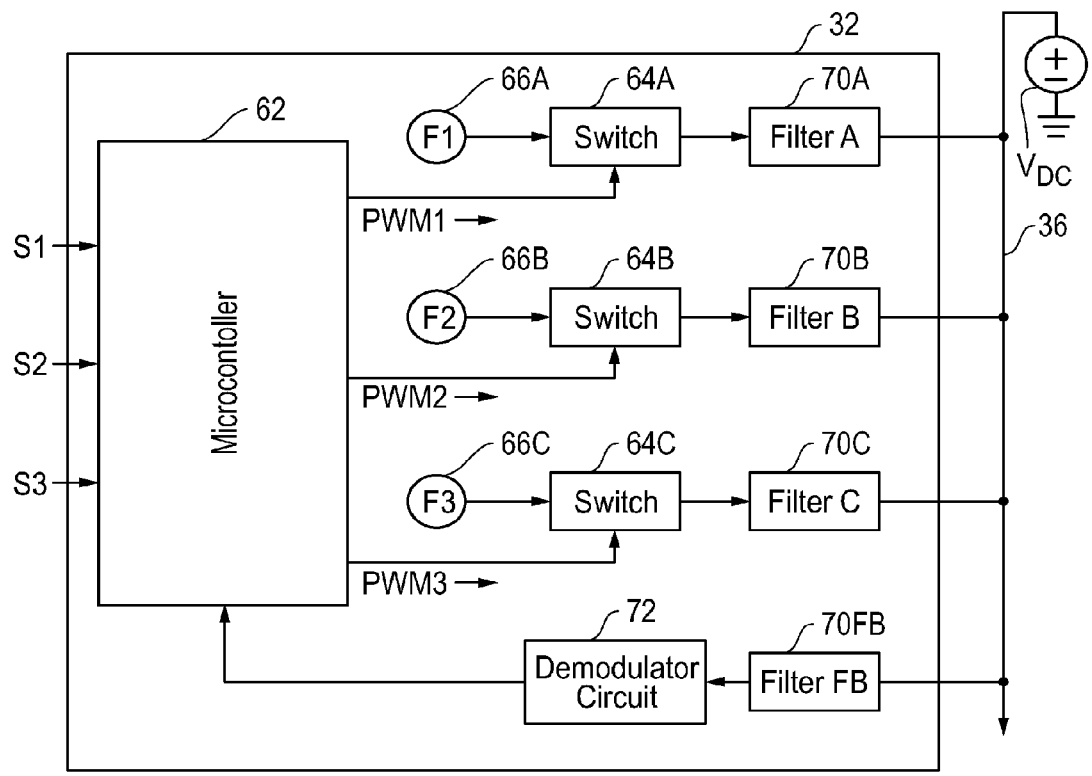
FIG. 5 illustrates in block diagram form, relevant components of an example of a control module shown in FIG. 3.

FIG. 5 illustrates in block diagram form, relevant components of an example control module 32. As shown in FIG. 5, control module 32 includes a microcontroller 62 coupled to receive analog input signals S1-S3. Although not shown, microcontroller 62 includes one or more A/D converters for converting the analog input signals S1-S3 into respective digital equivalents, it being understood that in an alternative embodiment microcontroller 62 may receive digital equivalents of analog input signals S1-S3. Microcontroller 62 includes a CPU that processes the digital equivalents of S1-S3 in accordance with instructions stored in memory to produce pulse width modulated signals PWM1-PWM3.

Control module 32 of FIG. 5 includes switches 64A-64C coupled between oscillator circuits 66A-66C, respectively, and filters 70A-70C, respectively. Oscillator circuits 66A-66C generate sinusoidal carriers. More particularly, oscillator circuits 66A-66C generate carriers F1-F3, respectively. During the duty cycle of pulse width modulated signals PWM1-PWM3, described above, switches 64A-64C couple the carrier outputs of oscillator circuits 66A-66C to filters 70A-70C, respectively. In doing so, carriers F1-F3 are modulated relative to pulse width modulated signals PWM1-PWM3, respectively.

Figure 6:
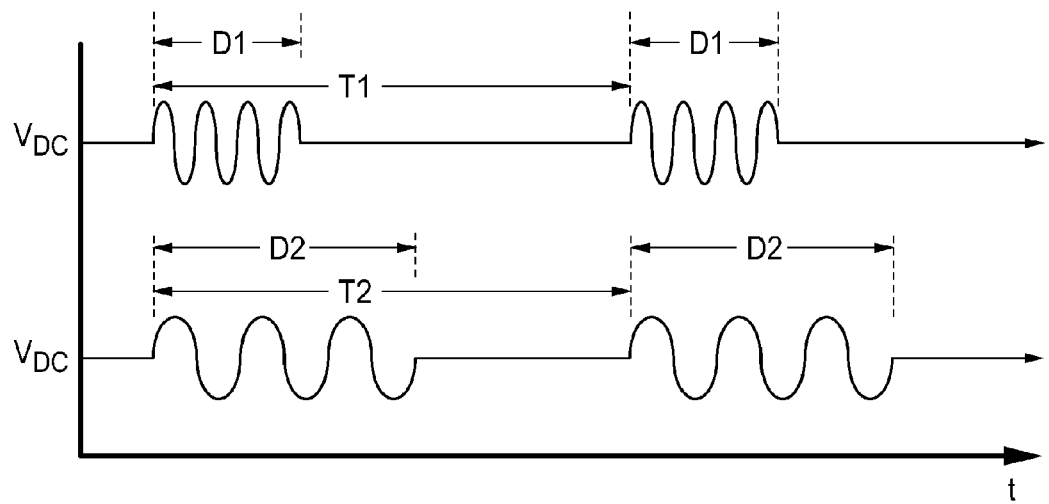
FIG. 6 graphically illustrates examples of modulated carriers.

The outputs of filters 70A-70C are coupled to conductor 36. Filters 70A-70C are configured to pass a narrow band of frequencies that are centered around the frequencies of carriers F1-F3, respectively. Filters 70A-70C operate to protect control module 32 from damage that could occur by direct coupling of switches 64A-64C to power source $V_{DC}$ via conductor 36. FIG. 6 graphically illustrates examples of modulated carriers F1 and F2 as they are simultaneously transmitted over conductor 36.

Control module 32 may also include one or more circuits for demodulating respective signals from one or more load controllers. FIG. 5 shows one demodulating circuit 72 that is coupled between microcontroller 62 and filter 70D. Operation of circuits 70D and 72 will be more fully described below.

Microcontroller 62 generates pulse width modulated signals PWM1-PWM3, the duty cycles of which are proportional to the amplitude of analog input signals S1-S3, respectively. Pulse width modulated control signals PWM1-PWM3 are provided to gates of switches 64A-64C. During the duty cycles of PWM1-PWM3, switches 64A-64C couple their carrier inputs F1-F3, respectively, to power line 36 via filters 70A-70C, respectively. In doing so, carriers F1-F3 are modulated. Because the carriers F1-F3 have distinct frequencies, conductor 36 can transmit modulated carriers F1-F3 without constructive or destructive interference.

Figure 7A:
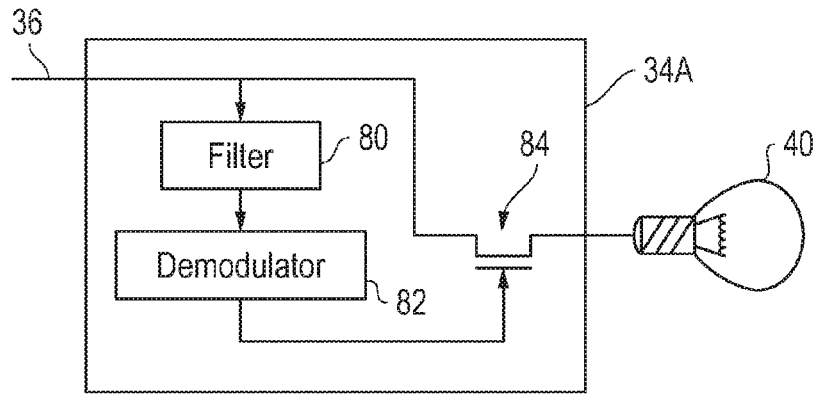
FIGS. 7A-7D illustrate in block diagram form relevant components of example load controllers The use of the same reference symbols in different drawings indicates similar or identical items.
Figure 7B:
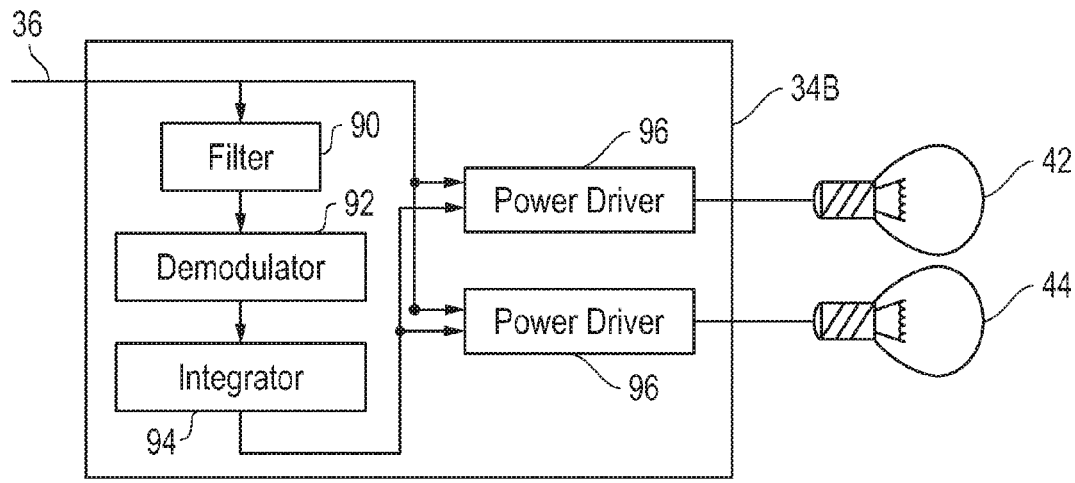
Figure 7C:
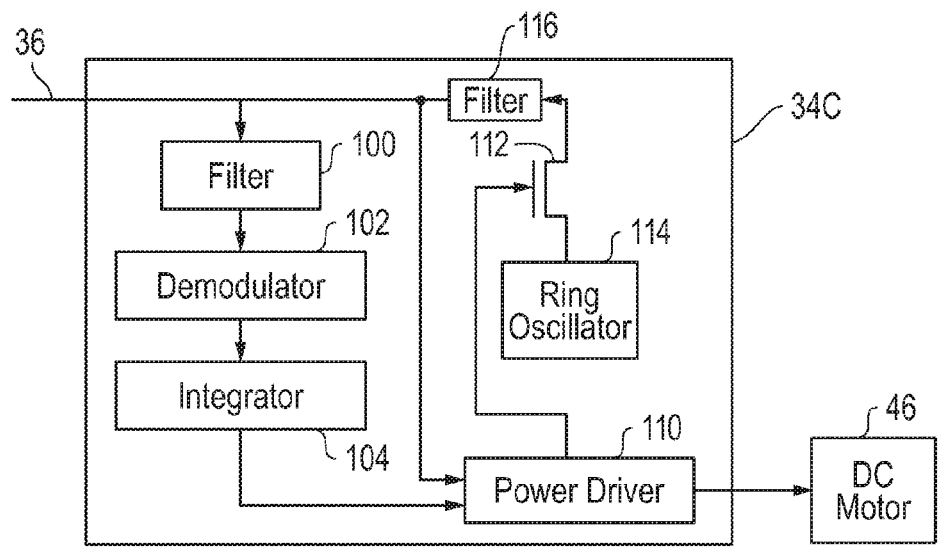
Figure 7D:
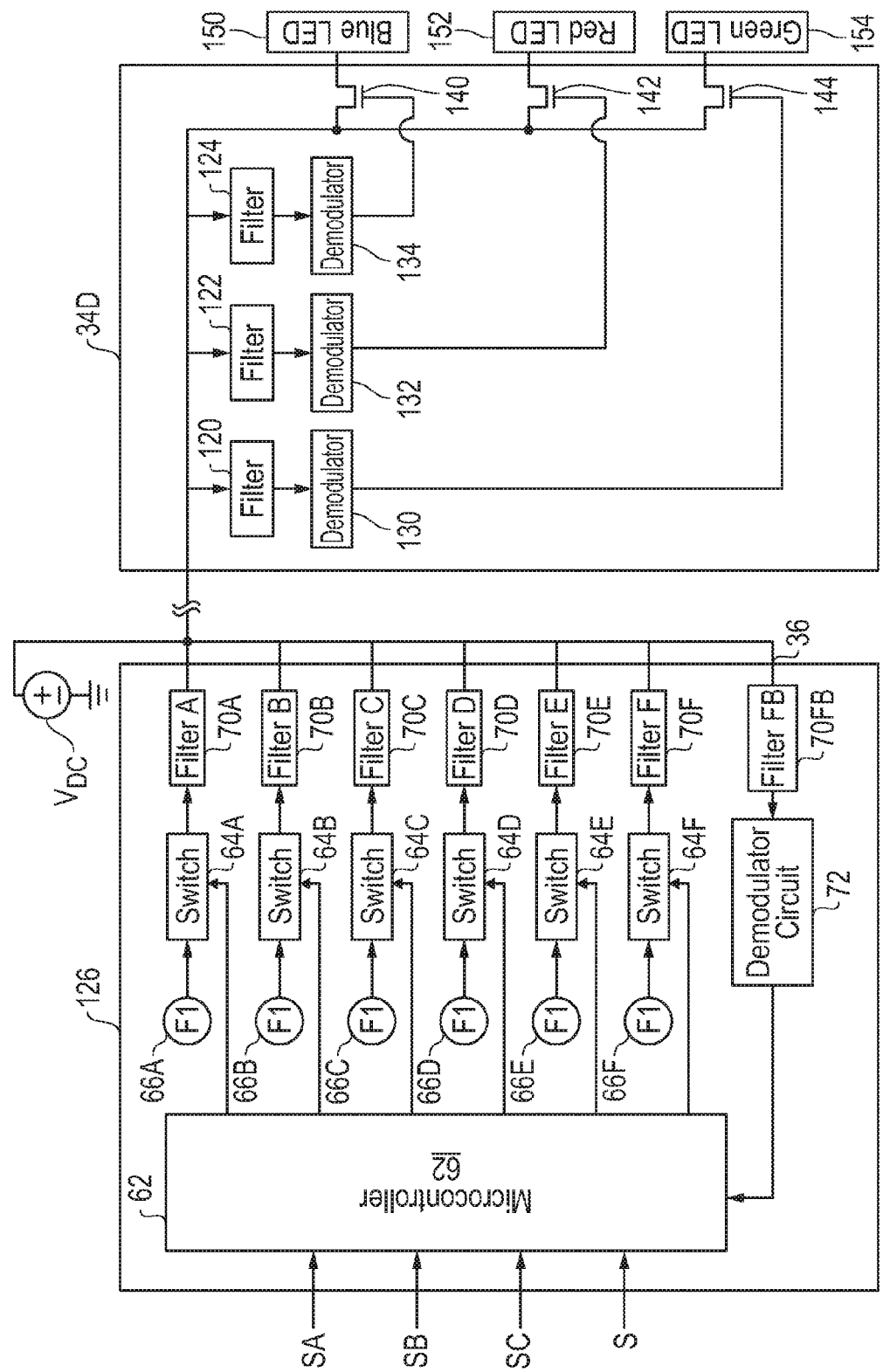

FIGS. 7A-7C illustrate in block diagram form relevant components of example load controllers 34A-34C, respectively. Load controller 34A shown in FIG. 7A includes a filter circuit 80 having an input coupled to power line 36 (see FIG. 5) and an output coupled to a demodulator circuit 82. Filter 80 is configured to pass selected signals to demodulator 82. More particularly, filter 80 passes signals having a frequency at or near the frequency of carrier F1. In this configuration, filter 80 blocks carriers F2 and F3. Filter 80 also blocks DC or low frequency signal components including those generated by power source $V_{DC}$.

In operation, filter 80 passes modulated carrier F1 to demodulator 82, which demodulates the signal to reproduce PWM1. The demodulator output should be identical or nearly identical to the pulse width modulated signal PWM1 output of microcontroller 62. The output from demodulator 82 is provided to a power driver, which includes power field effect transistor (FET) 84. During the duty cycle of the demodulator output, FET 84 couples lamp 40 to power source $V_{DC}$ with little or no impedance, and lamp 40 emits light at full power. FET 84 is switched off and no electrical power flows to lamp 40 when the PWM1 output of demodulator 82 is "off." Because the duty cycle of the PWM1 output of demodulator 82 is proportional to the amplitude of analog input signal S1, the intensity of light emitted by lamp 40 is proportional to the amplitude of analog input signal S1. This effect assumes that the period of pulse width modulated signal PWM1 is sufficiently high that the human eye cannot detect the distinct on/off states of lamp 40.

Load controller 34B in FIG. 7B includes a filter circuit 90 having an input coupled to conductor 36, and an output coupled to an input of a demodulator circuit 92. Filter 90 operates like filter 80 described in FIG. 7A, except that filter 90 operates to pass signals having a narrow band of frequencies centered at the frequency of carrier F2. Thus, filter 90 passes modulated carrier F2, while blocking modulated carriers F1 and F3.

Demodulator 92 operates to reconstruct pulse width modulated signal PWM2 from modulated carrier F2. The demodulator output should be identical or nearly identical to the pulse width modulated signal PWM2 output of microcontroller 62. The output of demodulator is provided to integrator circuit 94, which in turn generates analog signal I2. In one embodiment, an integrator circuit like integrator circuit 94 operates by coupling a constant current source to a capacitor during the duty cycle. As the capacitor charges with current from the source, the voltage on the capacitor increases. The voltage at the capacitor at the end of the duty cycle represents analog signal I2. In this fashion integrator circuit 94 generates an analog signal I2, the amplitude of which is proportional to the duty cycle of the PWM2 output. I2 should also have an amplitude that is proportional, if not equal or substantially equal, to the amplitude of analog input signals S2, since the output of demodulator 92 is equal or substantially equal to PWM2, and since the duty cycle of PWM2 is proportional to the amplitude of S2. As the amplitude of analog input signal S2 varies with time, the amplitude of the analog signal I2 should vary proportionally.

Power drivers 96 receive analog signal I2. In an alternative embodiment, analog integration signal I2 can be amplified before it is received by power drivers 96. Regardless, drivers 96 are coupled between power source $V_{DC}$ (see FIG. 5) and lamps 44 and 50 as shown. Drivers control the flow of electrical power to lamps 42 and 44 in accordance with analog signal I2. In other words, power drivers 96 provide flows of electrical power to lamps 42 and 44 that are proportional to the amplitude of integration signal I2. If the amplitude of integration signal I2 is zero, no electrical power flows to lamps 42 and 44.

FIG. 7C illustrates in block diagram form relevant components of the load controller 34C shown in FIG. 3. Many components shown in FIG. 7C are similar to components in the load controller 34B of FIG. 7B. In FIG. 7C, load controller 34C includes a filter circuit 100 that is configured to pass modulated carrier F3 while blocking modulated carriers F1 and F2.

The output of filter 100, i.e., modulated carrier F3, is provided to the input of demodulator circuit 102, which reconstructs pulse width modulated signal PWM3 from modulated carrier F2. The output of demodulator 102 should be equal or substantially equal to pulse width modulated signal PWM3 that was generated by microcontroller 62. The output of demodulator 102 is provided to integrator circuit 104, which in turn generates analog signal I3. Integrator circuit 104 can be similar to integrator circuit 94 described above, except integrator circuit generates analog integration signal I3, the amplitude of which is proportional to the duty cycle of the PWM3 output. I3 should have an amplitude that is proportional, if not equal or substantially equal, to the amplitude of analog input signal S3, since the output of demodulator 102 is equal or substantially equal to PWM3, and since the duty cycle of PWM3 is proportional to the amplitude of S3. As the amplitude of analog input signal S3 varies in time, the amplitude of the analog signal I3 should vary proportionally.

Power driver 110 receives analog signal I3. In an alternative embodiment, analog signal I3 can be amplified before it is provided to power driver 110. Regardless, driver 110 is coupled between power source $V_{DC}$ (see FIG. 5) and DC motor 46 as shown. Driver 110 can vary the impedance it presents to DC motor 46 with variations in analog signal I3, which in turn varies the electrical power provided to DC motor 46. In other words, power driver 110 provides a flow of electrical power to DC motor 46 that is proportional to the amplitude of integration signal I3.

In the embodiment shown, power driver 110 includes current mirror or current sensor that generates a signal indicative of current flow to DC motor; if current flows to DC motor 46, the signal is asserted, and if no current flows to DC motor 46, the signal is not asserted. The gate of FET 112, which is coupled between an oscillator 114 and filter 116, receives the signal indicative of current flow is coupled. Oscillator 114 generates a carrier F4, the frequency of which should be distinct from the frequencies of carriers F1-F3. Carrier F4 is modulated relative to the signal indicative of current flow to DC motor 46, and this modulated carrier in turn is transmitted to control module 32 via conductor 36. In other words, when the signal input to the gate of FET 112 is asserted, thus indicating that current is flowing to DC motor 46, the output of oscillator 114 is coupled to conductor 36 via filter 116, and if no current flows to DC motor 46, carrier F4 is not transmitted to control module 32.

With continued reference to FIG. 7C and FIG. 5, filter 70D is configured to pass frequencies that are centered around the frequency of carrier F4. As such, filter 70 will pass modulated carrier F4 to demodulator circuit 72, while blocking modulated carrier F1-F3. The output of demodulator 72 should be a digital bit that is indicative of current flow to DC motor 46 (the output of demodulator 72 is asserted high when current flows to DC motor 46). This output is subsequently processed by microcontroller 62, this creating a closed loop system with respect to DV motor 46. Microcontroller 62 can use the output of demodulator 72 to infer whether a short or open circuit exists with DC motor 46 as mentioned above.

We claim:

1. A method comprising:
   generating a first PWM waveform signal, wherein a duty cycle of the first PWM waveform signal is proportional to an amplitude of a first signal;
   generating a first sinusoidal waveform signal having a first frequency;
   modulating the first sinusoidal waveform signal in relation to the first PWM waveform signal;
   transmitting the modulated first sinusoidal waveform signal to a circuit via a power conductor that couples a power source to the circuit;
   the circuit generating a demodulated signal by demodulating the modulated first sinusoidal waveform signal;
   generating a second PWM waveform signal, wherein a duty cycle of the second PWM waveform signal is proportional to an amplitude of a second signal;
   generating a second sinusoidal waveform signal at a second frequency;
   modulating the second sinusoidal waveform signal in relation to the second PWM waveform signal;
   transmitting the modulated second sinusoidal waveform signal to the circuit and to a second circuit via the power conductor that couples the power source to the second circuit;
   the second circuit generating a second demodulated signal by demodulating the modulated second sinusoidal waveform signal.

2. The method of claim 1 further comprising the circuit generating an integrated signal by integrating the demodulated signal during an integration cycle period.

3. The method of claim 2 further comprising:
   the circuit generating an amplified signal by amplifying the integrated signal;
   transmitting the amplified signal to an input of a power driver that is coupled to the power conductor.

4. The method of claim 3 wherein an output of the power driver is coupled to a power input of a load.

5. The method of claim 1 further comprising an act of transmitting the demodulated signal to a switch that is coupled to the power conductor.

6. The method of claim 1 further comprising an act of transmitting the demodulated signal to a gate of a FET that is coupled to the power conductor.

7. The method of claim 6 wherein the FET is coupled between the power conductor and a power input of a device.

8. The method of claim 1:
wherein the first frequency is distinct from the second frequency;
wherein the power conductor concurrently transmits the modulated first and second sinusoidal waveform signals.

9. An apparatus comprising:
a first PWM circuit for generating a first PWM waveform signal, wherein a duty cycle of the first PWM waveform signal is proportional to an amplitude of a first signal;
a first circuit for generating a first sinusoidal waveform signal having a first frequency;
a first modulator circuit for modulating the first sinusoidal waveform signal in relation to the first PWM waveform signal;
a power source;
a conductor coupled to an output of the power source and an output of the first modulator circuit;
a second PWM circuit for generating a second PWM waveform signal, wherein a duty cycle of the second PWM waveform signal is proportional to an amplitude of a second signal;
a second circuit for generating a second sinusoidal waveform signal having a second frequency that is distinct from the first frequency;
a second modulator circuit for modulating the second sinusoidal waveform signal in relation to the second PWM waveform signal;
wherein the conductor is coupled to an output of the second modulator circuit.

10. The apparatus of claim 9 further comprising
a first demodulator circuit coupled to receive the modulated first sinusoidal waveform signal from the first modulator circuit via the conductor;
wherein the first demodulator circuit is configured to generate a first demodulated signal by demodulating the modulated first sinusoidal waveform signal.

11. The apparatus of claim 10 further comprising:
a first power driver circuit coupled to a power input of a first load and the power source, wherein the first power driver circuit is coupled to the power source via the conductor;
wherein a control signal input of the first power driver circuit is coupled to receive the first demodulated signal.

12. The apparatus of claim 10 further comprising:
a first power driver circuit coupled to a power input of a first load and the power source, wherein the first power driver circuit is coupled to the power source via the conductor;
a first circuit coupled to receive the first demodulated signal and configured to generate a first control signal that is proportional to the first signal.

13. The apparatus of claim 12 wherein a control signal input of the first power driver circuit is coupled to receive the first control signal.

14. The apparatus of claim 12 further comprising:
an amplifier circuit configured to receive and amplify the first control signal;
wherein a control signal input of the first power driver circuit is coupled to receive the amplified first control signal.

15. An apparatus comprising:
a power source;
a conductor coupled to the power source and configured to transmit electrical power;
a first demodulator circuit coupled to the conductor and configured to receive a first modulated signal via the conductor;
wherein the first demodulator circuit is configured to generate a first PWM signal in response to demodulating the first modulated signal;
a second demodulator circuit coupled to the conductor and configured to receive a second modulated signal via the conductor;
wherein the second demodulator circuit is configured to generate a second PWM signal in response to demodulating the second modulated signal;
wherein the second demodulator circuit is configured to receive the second modulated signal while the first demodulator receives the first modulated signal.

16. The apparatus of claim 15 further comprising a switch coupled between the conductor and a load, wherein the switch comprises a control input coupled to receive the first PWM signal.

17. The apparatus of claim 15 further comprising:
a circuit for generating an analog control signal, wherein a voltage amplitude of the analog control signal is proportional to a duty cycle of the first PWM signal;
a power driver coupled to the conductor and a load, wherein the power driver comprises a an input configured to receive the analog control signal.

* * * * *